United States Patent
Kim et al.

(10) Patent No.: US 10,847,313 B2
(45) Date of Patent: Nov. 24, 2020

(54) ELECTRONIC COMPONENT AND BOARD FOR MOUNTING OF THE SAME

(71) Applicant: SAMSUNG ELECTRO-MECHANICS CO., LTD., Suwon-Si, Gyeonggi-do (KR)

(72) Inventors: Ho Yoon Kim, Suwon-Si (KR); Sang Soo Park, Suwon-Si (KR); Woo Chul Shin, Suwon-Si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 9 days.

(21) Appl. No.: 16/200,631

(22) Filed: Nov. 26, 2018

(65) Prior Publication Data

US 2020/0090863 A1    Mar. 19, 2020

(30) Foreign Application Priority Data

Sep. 13, 2018   (KR) .................. 10-2018-0109371

(51) Int. Cl.
  *H01G 2/06*   (2006.01)
  *H01G 4/30*   (2006.01)
  (Continued)

(52) U.S. Cl.
  CPC ............ *H01G 2/065* (2013.01); *H01G 4/008* (2013.01); *H01G 4/012* (2013.01);
  (Continued)

(58) Field of Classification Search
  None
  See application file for complete search history.

(56) References Cited

U.S. PATENT DOCUMENTS 9,613,753 B2 *   4/2017  Maeda .................... H01G 4/30
2004/0183147 A1 *  9/2004  Togashi ................ H01G 2/065
                                                              257/414
(Continued)

FOREIGN PATENT DOCUMENTS

JP    2001-185446 A    7/2001
JP    2014-229867 A   12/2014
(Continued)

OTHER PUBLICATIONS

Office Action issued in corresponding Korean Application No. 10-2018-0109371, dated May 22, 2019.

*Primary Examiner* — Dion Ferguson
(74) *Attorney, Agent, or Firm* — Morgan, Lewis & Bockius LLP

(57)  ABSTRACT

An electronic component and a mounting board for mounting of the same are provided. The electronic component includes a body including external electrodes disposed on surfaces of the body opposing each other in a first direction, respectively, and metal frames connected to the external electrodes, respectively. The metal frames include supports bonded to the external electrodes and mounting portions extending from lower ends of the supports in the first direction and are spaced apart from the body and the external electrodes. The supports include a lower support portion disposed on a lower side of the body and an upper support portion disposed on an upper side of the body, and the lower support portion has a thickness in a second direction perpendicular to the first direction relatively greater than a thickness of the upper support portion in the first direction.

19 Claims, 7 Drawing Sheets

(51) Int. Cl.
*H01G 4/008* (2006.01)
*H01G 4/012* (2006.01)
*H05K 1/18* (2006.01)
*H01G 4/12* (2006.01)

(52) U.S. Cl.
CPC ............ *H01G 4/1227* (2013.01); *H01G 4/30* (2013.01); *H05K 1/181* (2013.01); *H05K 2201/10015* (2013.01)

(56) References Cited

U.S. PATENT DOCUMENTS

| | | | | |
|---|---|---|---|---|
| 2010/0123995 | A1* | 5/2010 | Otsuka | H01G 2/06 361/308.1 |
| 2014/0063687 | A1* | 3/2014 | Saito | H01G 4/228 361/308.1 |
| 2014/0238732 | A1* | 8/2014 | Itabashi | H01H 85/10 174/260 |
| 2015/0114697 | A1* | 4/2015 | Murrell | H01G 4/232 174/255 |
| 2015/0131202 | A1* | 5/2015 | Masuda | H01G 4/38 361/301.4 |
| 2016/0086730 | A1 | 3/2016 | Park et al. | |
| 2016/0212843 | A1* | 7/2016 | Park | H01G 4/01 |
| 2018/0033556 | A1* | 2/2018 | Itamochi | H01C 7/008 |
| 2018/0211784 | A1* | 7/2018 | Ando | H01G 2/06 |

FOREIGN PATENT DOCUMENTS

| | | |
|---|---|---|
| JP | 2015-88616 A | 5/2015 |
| KR | 10-2015-0118386 A | 10/2015 |
| KR | 10-2016-0035494 A | 3/2016 |

* cited by examiner

ELECTRONIC COMPONENT AND BOARD FOR MOUNTING OF THE SAME

CROSS-REFERENCE TO RELATED APPLICATION(S)

This application claims benefit of priority to Korean Patent Application No. 10-2018-0109371 filed on Sep. 13, 2018 in the Korean Intellectual Property Office, the disclosure of which is incorporated herein by reference in its entirety.

TECHNICAL FIELD

The present disclosure relates to an electronic component and a board for mounting of the same.

BACKGROUND

A multilayer capacitor has been used as a component of various electronic devices due to advantages thereof such as compactness and high capacitance.

Such a multilayer capacitor includes a plurality of dielectric layers and internal electrodes, having different polarities, alternately laminated between the dielectric layers.

The dielectric layers have piezoelectric properties. Accordingly, when a DC or an AC voltage is applied to the multilayer capacitor, a piezoelectric phenomenon may occur between the internal electrodes to generate periodic vibrations while expanding and contracting a capacitor body.

Vibrations may be transferred to a board through solders connecting external electrodes to the board. Thus, the entire board may serve as an acoustically reflective surface to generate vibratory sound as noise.

Vibratory sound may correspond to audible frequencies ranging from 20 Hz to 2000 Hz, causing listener discomfort, and such vibratory sound which may cause listener discomfort is known as acoustic noise.

An electronic component having a structure, in which multilayer capacitors are mounted at regular distances from a board using a metal frame, has been proposed to reduce such vibrations.

However, since the multilayer capacitors are supported by the metal frame to allow the electronic component to float over an upper end of the board during board mounting, a center of gravity of the electronic component is at the upper end of the board. Accordingly, the electronic component easily topples over when being mounted, resulting in poor conductivity.

Moreover, since a distance from the board to an internal electrode of the multilayer capacitor increases, equivalent series resistance (ESR) and equivalent series inductance (ESI) may increase.

SUMMARY

An aspect of the present disclosure is to provide an electronic component which decreases acoustic noise as well as ESR and ESL and prevents poor conductivity during board mounting and a board for mounting of the electronic component.

According to an aspect of the present disclosure, an electronic component includes a body including external electrodes disposed on surfaces of the body opposing each other in a first direction, respectively, and metal frames connected to the external electrodes, respectively. The metal frames include supports bonded to the external electrodes and mounting portions extending from lower ends of the supports in the first direction and are spaced apart from the body and the external electrodes. The supports include a lower support portion disposed on a lower side of the body and an upper support portion disposed on an upper side of the body, and the lower support portion has a thickness in a second direction perpendicular to the first direction relatively greater than a thickness of the upper support portion in the first direction.

The lower support portion of the supports may have the same length in the first direction as a length of the mounting portion in the first direction.

The upper support portion and the lower support portion of the supports may have external surfaces forming a single flat surface.

The body may include dielectric layers and first and second internal electrodes alternately disposed with the dielectric layers interposed therebetween in a thickness direction of the body which is the same as the second direction.

The external electrodes may include head portions disposed on the surfaces of the body in the first direction and bonded to the supports and band portions extending from the head portions to portions of top and bottom surfaces of the body and portions of both side surfaces of the body.

The electronic component may further include conductive bonding portions disposed between the head portions of the external electrodes and the upper support portion of the supports.

The lower support portion of the supports may be disposed at a point where an internal side surface of the lower support portion matches an end of the band portion disposed above an upper side of the body.

The external electrodes and the metal frames may include plating layers.

According to an aspect of the present disclosure, a mounting board for mounting of an electronic component includes a board having a pair of land patterns disposed on a top surface of the board to be spaced apart from each other and an electronic component mounted in such a manner that mounting portions of metal frames are connected to the land patterns of the board, respectively.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
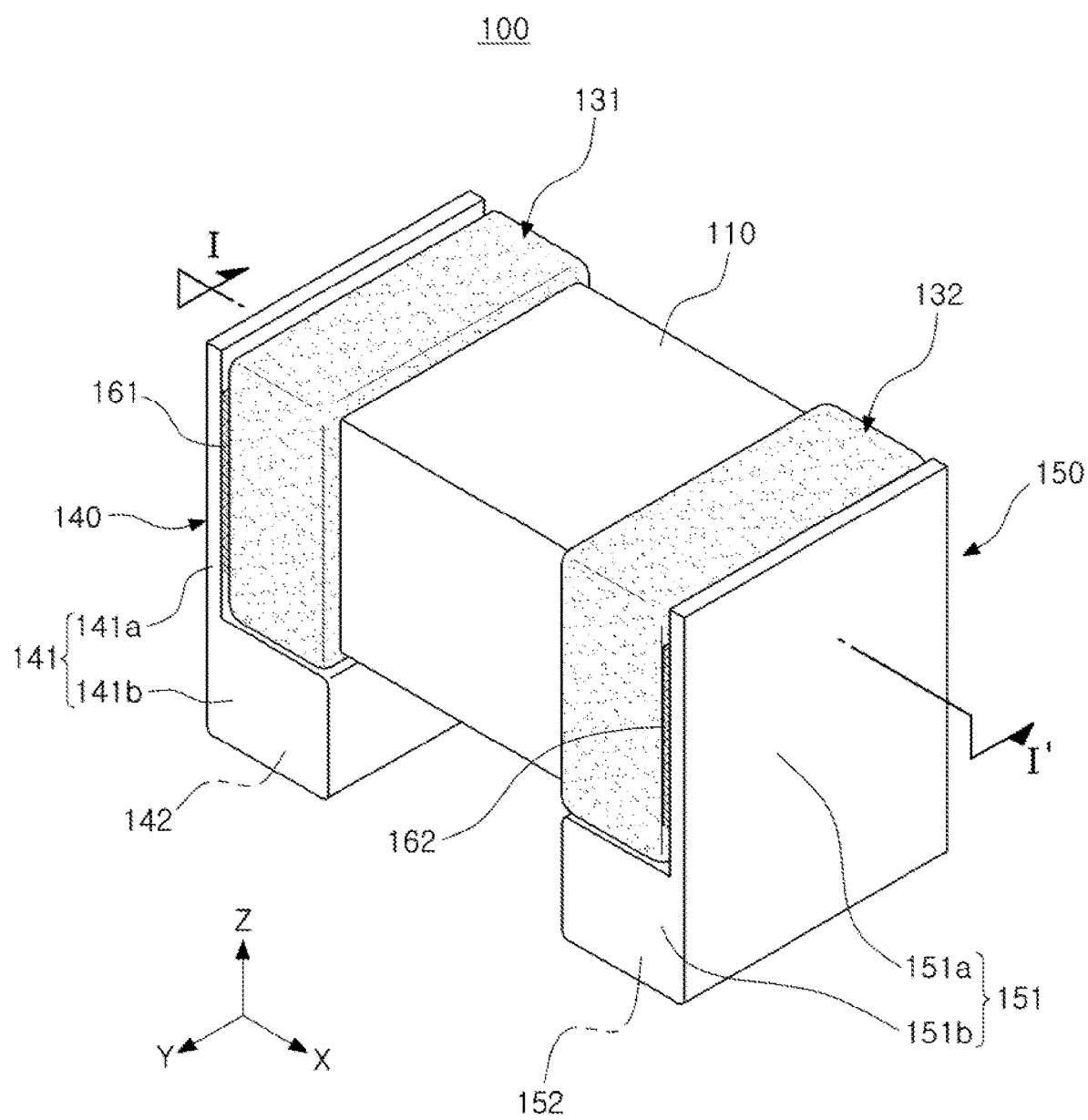
FIG. 1 is a perspective view of an electronic component applied to an exemplary embodiment in the present disclosure.

Hereinafter, embodiments in the present disclosure will be described as follows with reference to the attached drawings.

The present disclosure may, however, be embodied in many different forms and should not be construed as being limited to the embodiments set forth herein.

Rather, these embodiments are provided so that this disclosure will be thorough and complete, and will fully convey the scope of the present disclosure to those skilled in the art.

In the drawings, the shapes and dimensions of elements may be exaggerated for clarity, and the same reference numerals will be used throughout to designate the same or like components.

Also, elements having the same function within a scope of the same concept illustrated in drawings of respective embodiments will be described using the same reference numerals.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

To clarify embodiments in the present disclosure, directions may be defined as follows: X, Y, and Z indicated in drawings denote a length direction, a width direction, and a thickness direction of a multilayer capacitor and an interposer, respectively.

In exemplary embodiments, the Z direction may be used to have the same concept as a lamination direction in which dielectric layers are laminated.

Figure 2:
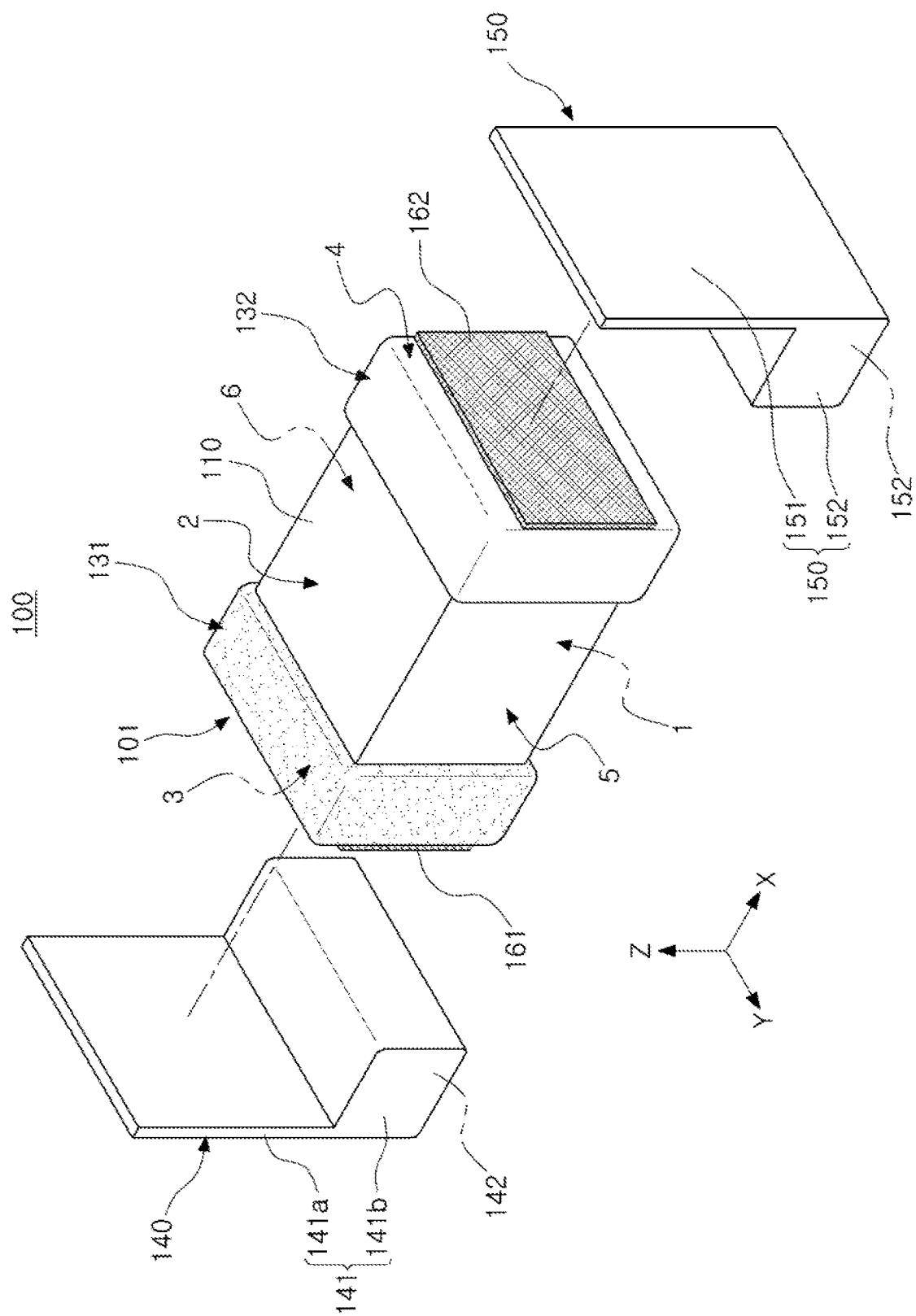
FIG. 2 is an exploded perspective view of FIG. 1.
Figure 3:
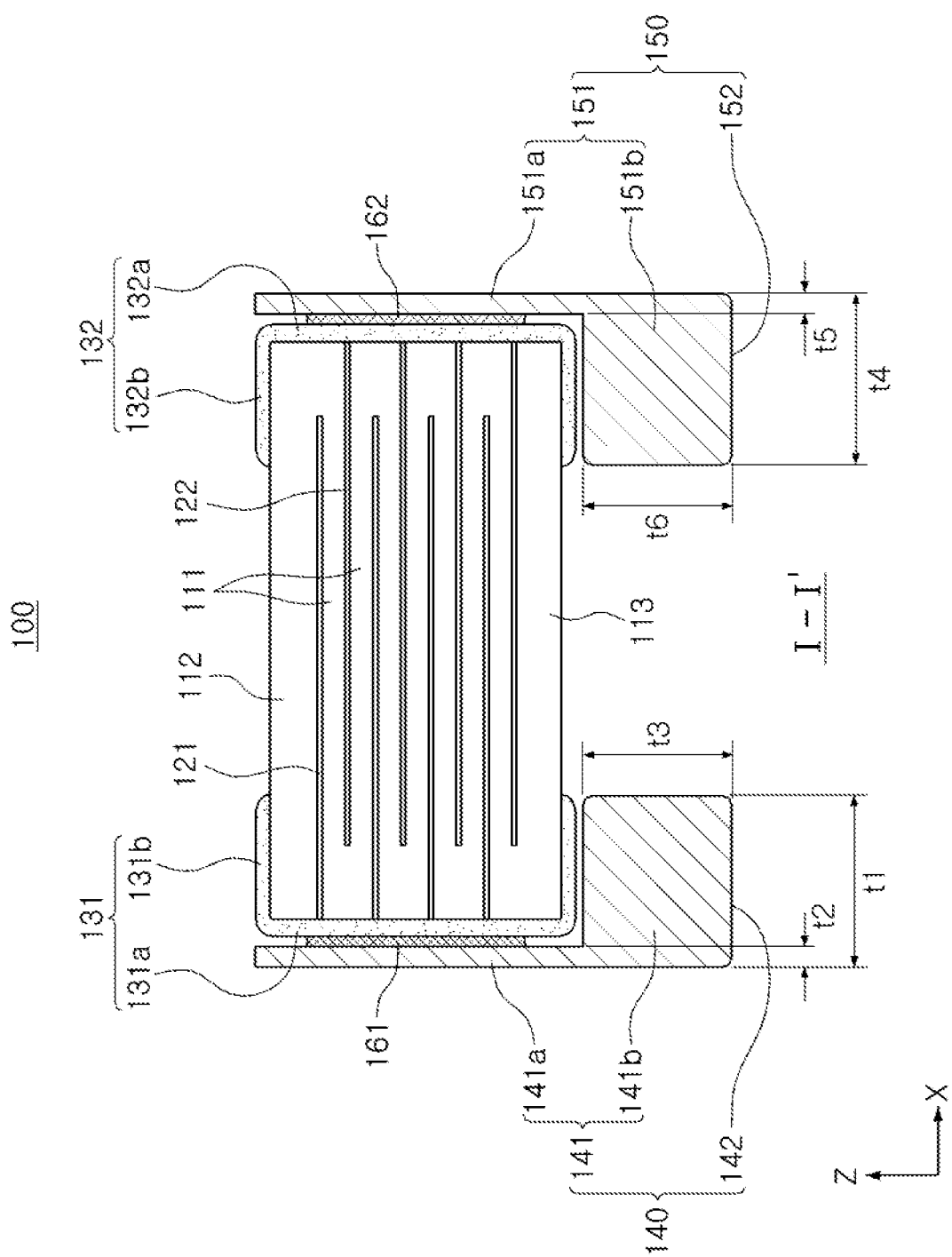
FIG. 3 is a cross-sectional view taken along line I-I' in FIG. 1.
Figure 4A:
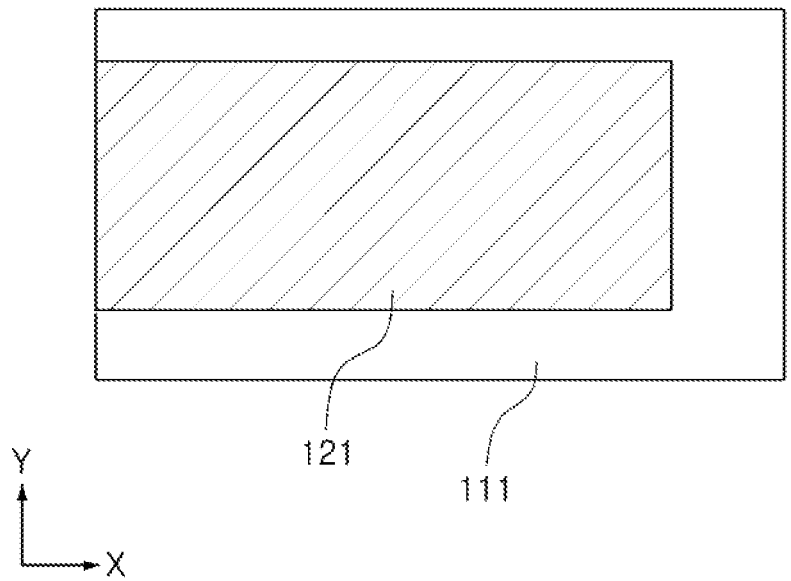
FIGS. 4A and 4B are plan views of first and second internal electrodes applied to the multilayer capacitor in FIG. 1, respectively.
Figure 4B:
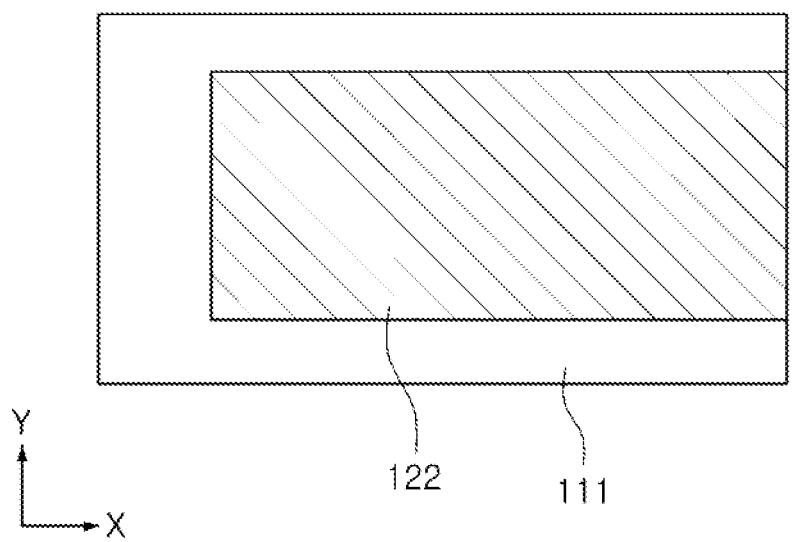

FIG. 1 is a perspective view of an electronic component applied to an exemplary embodiment in the present disclosure. FIG. 2 is an exploded perspective view of FIG. 1, and FIG. 3 is a cross-sectional view taken along line I-I' in FIG. 1. FIGS. 4A and 4B are plan views of first and second internal electrodes applied to the multilayer capacitor in FIG. 1, respectively.

Referring to FIGS. 1 to 4B, an electronic component 100 includes a multilayer capacitor 101 and first and second metal frames 140 and 150.

The multilayer capacitor 101 includes a body 110, and first and second external electrodes 131 and 132 disposed on both end portions of the body 110 in an X direction defined as a first direction of the body 110, respectively.

The body 110 is formed by laminating a plurality of dielectric layers 111 in a Z direction and sintering, and then is sintered. Adjacent dielectric layers 111 may be integrated with each other such that boundaries therebetween may not be readily apparent without using a scanning electron microscope (SEM).

Also the body 110 includes a plurality of dielectric layers 111 and first and second internal electrodes 121 and 122, having different polarities, alternately disposed in a Z direction with the dielectric layers 111 interposed therebetween.

The body 110 may include an active region as a portion contributing to formation of capacitance of the capacitor body 110, and cover regions 112 and 113 as margin portions prepared in upper and lower portions of the active region in the Z direction, respectively.

The body 110 is not limited in shape, but may have a hexahedral shape. The capacitor body 110 may have first and second surfaces 1 and 2 disposed to oppose each other in the Z direction, third and fourth surfaces 3 and 4 connected to the first and second surfaces 1 and 2 and disposed to oppose each other in the X direction, and fifth and sixth surfaces 5 and 6 connected to the first and second surfaces 1 and 2 as well as the third and fourth surfaces 3 and 4 and disposed to oppose each other in the W direction.

The dielectric layer 111 may include a ceramic powder, for example, a barium titanate ($BaTiO_3$)-based ceramic powder or the like.

The $BaTiO_3$-based ceramic powder may be $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$ in which calcium (Ca) or zirconium (Zr) is partially employed in $BaTiO_3$, but a material of the ceramic powder is not limited thereto.

In addition to the ceramic powder, a ceramic additive, an organic solvent, a plasticizer, a binders, and a dispersant may be further added to the dielectric layer 111.

The ceramic additive may include, for example, a transition metal oxide or a transition metal carbide, a rare earth element, magnesium (Mg), aluminum (Al), or the like.

The first and second internal electrodes 121 and 122, as electrodes applied with different polarities, may be disposed on the dielectric layer 111 to be laminated in the Z direction. The first and second internal electrodes 121 and 122 may be alternately disposed to oppose each other with a single dielectric layer 111 interposed therebetween inside the capacitor body 110 in Z direction.

In this case, the first and second internal electrodes 121 and 122 may be electrically insulated from each other by the dielectric layer 111 disposed in the middle thereof.

While a structure in which internal electrodes are laminated in the Z direction has been described in the present disclosure, the present disclosure is not limited to the structure. If necessary, the present disclosure may be applied to a structure in which internal electrodes are laminated in the Y direction.

Ends of the first and second internal electrodes 121 and 122 may be exposed through the third and fourth surfaces 3 and 4 of the capacitor body 110, respectively.

The ends of the first and second electrodes 121 and 122 alternately exposed through the third and fourth surfaces 3 and 4 of the body 110 may be connected to the first and second external electrodes 131 and 132 disposed on both ends in the X direction of the capacitor body 110, which will be described later, to be electrically connected thereto, respectively.

According to the above-described configuration, charges are accumulated between the first and second internal electrodes 121 and 122 when a predetermined voltage is applied to the first and second external electrodes 131 and 132.

In this case, capacitance of the multilayer capacitor 100 may be proportional to an overlapping area between the first and second internal electrodes 121 and 122 overlapping each other in the active region in the Z direction.

The first and second inner electrodes 121 and 122 may be formed using a conductive paste formed of at least one of a noble metal material such as platinum (Pt), palladium (Pd), and a palladium-silver (Pd—Ag) alloy, nickel (Ni), and copper (Cu), but a material thereof is not limited thereto.

The conductive paste may be printed by means of a screen printing method, a gravure printing method, or the like, but the printing method is not limited thereto.

The first and second external electrodes 131 and 132 may be provided with voltages having different polarities and may be disposed on both ends in the X direction of the capacitor body 110. The first and second external electrodes 131 and 132 may be connected to the exposed ends of the first and second internal electrodes 121 and 122, respectively, to be electrically connected to each other.

The first external electrode 131 may include a first head portion 131a and a first band portion 131b.

The first head portion 131a is disposed on the third surface 3 of the body 110 and is in contact with an end exposed outwardly of the first internal electrode 121 through the third surface 3 of the body 10 to electrically connect the first internal electrode 121 to the first external electrode 131.

The first band portion 131b is a portion extending from the first head portion 131a to portions of the first, second, fifth, and sixth surfaces 1, 2, 5, and 6 of the body 110 to improve fixing strength or the like.

The second external electrode 132 may include a second head portion 132a and a second band portion 132b.

The second head portion 132a is disposed on the fourth surface 4 of the capacitor body 110 and is in contact with an end exposed outwardly of the second internal electrode 122 through the fourth surface 4 of the body 110 to electrically connect the second internal electrode 122 to the second external electrode 132.

The second band portion 132b is a portion extending from the head portion 132a to portions of the first, second, fifth, and sixth surfaces 1, 2, 5, and 6 of the body 110 to improve fixing strength or the like.

The first and second external electrodes 131 and 132 may further include plating layers.

The plating layers may include first and second nickel (Ni) plating layers and first and second tin (Sn) plating layers covering the first and second nickel plating layers, respectively.

The first metal frame 140 includes a first support 141 and a first mounting portion 142.

The first support 141 is disposed perpendicularly to the first surface 1 that is a mounting surface.

The first support 141 includes a first upper support portion 141a and a first lower support portion 141b.

The first upper support portion 141a is a portion disposed to oppose to the first head portion 131a of the first external electrode 131 and bonded to the first head portion 131a of the first external electrode 131. The first upper support portion 141a electrically connects the first metal frame 140 to the first external electrode 131. The first upper support portion 141a bonds the first metal frame 140 to the first external electrode 131 and provides mechanical coupling between the first metal frame 140 and the first external electrode 131.

A first conductive bonding portion 161 may be prepared between the first external electrode 131 and the first upper support portion 141a of the first support 141. In this case, the first lower support portion 141b, together with the first mounting portion 142, is electrically and mechanically coupled to the first external electrode 131 through the first upper support portion 141a and the first conductive bonding portion 161.

The first conductive bonding portion 161 may be formed of a high-temperature solder or a conductive adhesive, but a material thereof is not limited thereto.

The first lower support portion 141b is disposed below a lower side of the body 110 in the Z direction, and is spaced apart from the first band portion 131b of the first external electrode 131 by a predetermined distance. Air or gas, rather than a material having a solid form, may exist in such a predetermined distance.

The first lower support portion 141b has an X-direction thickness t1 relatively greater than an X-direction thickness t2 of the first upper support portion 141a. The first lower support portion 141b has a Z-direction thickness t3 relatively greater than the X-direction thickness t2 of the first upper support portion 141a.

The first lower support portion 141b may be disposed at a point where an internal side surface of the first lower support portion 141b substantially matches an end of the first band portion 131b disposed above an upper side of the body 110 in the X direction, in the Z direction.

In the first support 141, an external surface of the first upper support portion 141a and an external surface of the first lower support portion 141b may form a single flat surface.

The first mounting portion 142 is a portion extending from a lower end of the first support 141 in the X direction, which is a first direction, to be parallel to the first surface 1 that is a mounting surface, and serves as a connection terminal during board mounting.

In an exemplary embodiment, the first mounting portion 142 may be a bottom surface of the first lower support portion 141b of the first support 141.

Accordingly, the first lower support portion 141b may have the same X-direction length as the first mounting portion 142.

The second metal frame 150 includes a second support 151 and a second mounting portion 152.

The second support 151 is disposed perpendicularly to the first surface 1 that is a mounting surface.

The second support 151 includes a second upper support portion 151a and a second lower support portion 151b in the Z direction.

The second lower support portion 151b is a portion disposed to oppose to the second head portion 132a of the second external electrode 132 and bonded to the second head portion 132a of the second external electrode 132. The second lower support portion 151b electrically connects the second metal frame 150 to the second external electrode 132. The second upper support portion 151a bonds the second metal frame 150 to the second external electrode 132 and provides mechanical coupling between the second metal frame 150 and the second external electrode 132.

A second conductive bonding portion 162 may be prepared between the second external electrode 132 and the second upper support portion 151a of the second support 151. In this case, the second lower support portion 151b, together with the second mounting portion 152, is electrically and mechanically coupled to the second external electrode 132 through the second upper support portion 151a and the second conductive bonding portion 162.

The second conductive bonding portion 162 may be formed of a high-temperature solder or a conductive adhesive, but a material thereof is not limited thereto.

The second lower support portion 151b is disposed below a lower side of the body 110 in the Z direction, and is spaced apart from the second band portion 132b of the second external electrode 132 by a predetermined distance. Air or gas, rather than a material having a solid form, may exist in such a predetermined distance.

The second lower support portion 151b has an X-direction thickness t4 relatively greater than an X-direction thickness t5 of the second upper support portion 151a. The second lower support portion 151b has a Z-direction thickness t6 relatively greater than the X-direction thickness t5 of the second upper support portion 151a. t1 may be equal to or substantially equal to t4, t2 may be equal to or substantially equal to t5, and t3 may be equal to or substantially equal to t6.

The second lower support portion 151b may be disposed at a point where an internal side surface of the second lower support portion 151b substantially matches an end of the second band portion 132b disposed above an upper side of the body 110 in the Z direction.

In the second support 151, an external surface of the second upper support portion 151a and an external surface of the second lower support portion 151b may constitute a single flat surface.

The second mounting portion 152 is a portion extending from a lower end of the second support 151 in the X direction, which is the first direction, to be parallel to the first surface 1 that is a mounting surface, and serves as a connection terminal during board mounting.

In an exemplary embodiment, the second mounting portion 152 may be a bottom surface of the second lower support portion 151b of the second support 151.

Accordingly, the second lower support portion 151b may have the same X-direction length as the second mounting portion 152.

The first and second metal frames 140 and 150 may further include plating layers.

The plating layers may include first and second nickel (Ni) plating layers, and first and second tin (Sn) plating layers covering the first and second nickel plating layers, respectively.

Figure 5:
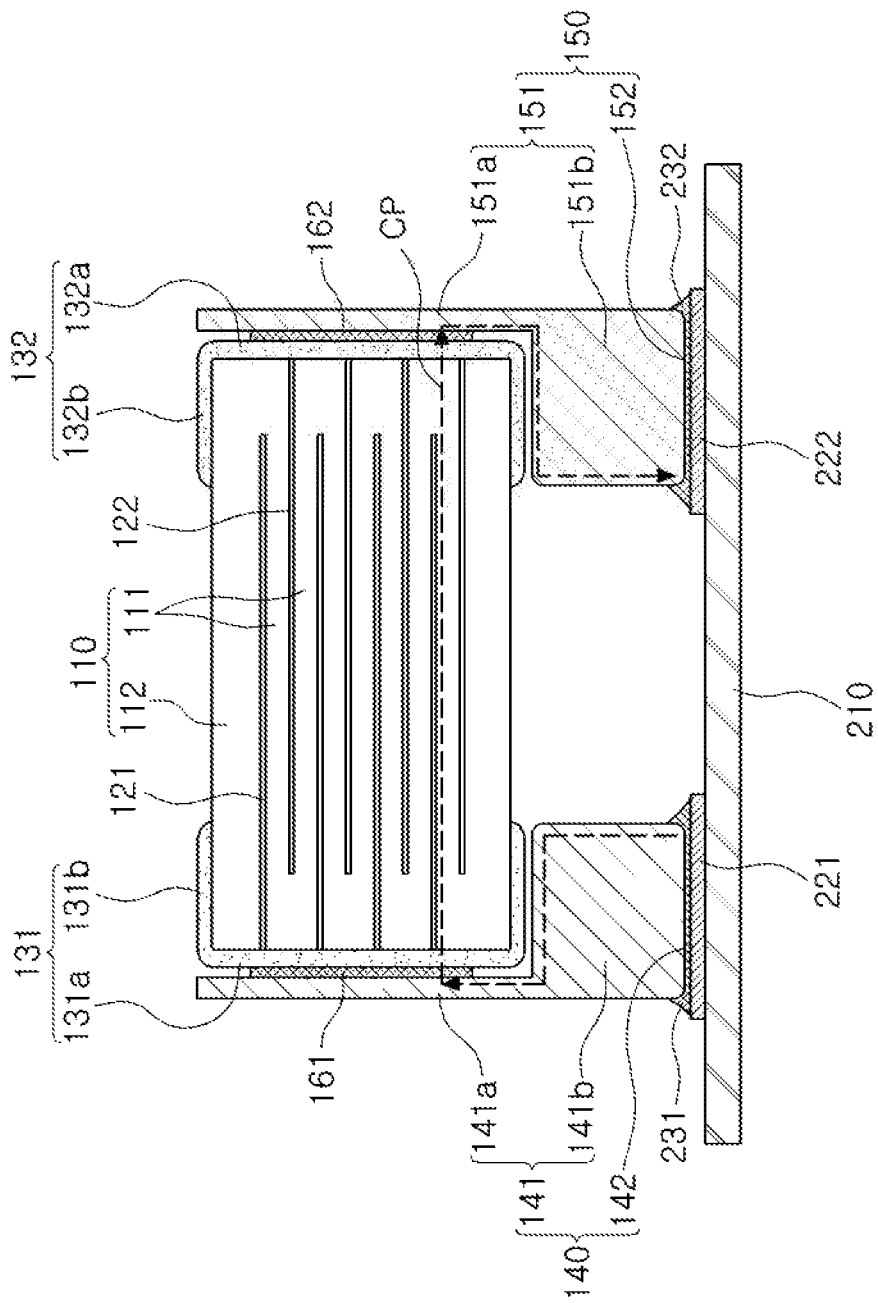
FIG. 5 is a cross-sectional view showing a state in which the electronic component in FIG. 1 is mounted on a board.

FIG. 5 is a cross-sectional view showing a state in which the electronic component in FIG. 1 is mounted on a board.

Referring to FIG. 5, a mounting board according to an exemplary embodiment includes a board 210, and first and second land patterns 221 and 222 disposed on a top surface of the board 210 to be spaced apart from each other.

In the electronic component 100, the first and second mounting portions 142 and 152 of the first and second metal frames 140 and 150 are connected to the first and second land patterns 221 and 222, respectively. Thus, the first and second mounting portions 142 and 152 of the first and second metal frames 140 and 150 are bonded and electrically with the first and second land patterns 221 and 222 by conductive adhesive members 231 and 232 such as solder, respectively.

A related-art multilayer capacitor has a structure in which a capacitor and a substrate are brought into direct contact with each other by a solder. Since heat generated in a board or mechanical deformation is directly transferred to the multilayer capacitor, it is difficult to secure high-level reliability.

In the electronic component 100 according to the present embodiment, the first and second metal frames 140 and 150 are bonded to both end surfaces of the multilayer capacitor 101 to secure a distance between the multilayer capacitor 101 and the board 210. Thus, a stress from the board 210 may be prevented from being transferred to the multilayer capacitor 101 when the electronic component is mounted on the board 210. As a result, thermal reliability, mechanical reliability, and warping deformation resistance of the electronic component 100 may be improved.

Vibrations generated in the multilayer capacitor 101 are partially absorbed by the first and second metal frames 140 and 150 to decrease the amount of the vibrations transferred to the board 210. As a result, acoustic noise may be reduced.

In the case of an electronic component using a metal frame, a multilayer capacitor is supported by the metal frame to float over a board during board mounting. Thus, the electronic component easily topples over when mounting the electronic component, resulting in poor conductivity.

In an electronic component according to an exemplary embodiment, a lower support portion of a support of a metal frame has a thickness greater than a thickness of an upper support portion of the supports. Accordingly, a center of gravity of the electronic component moves down and a contact area of a mounting portion is increased. As a result, the electronic component may be stably supported to prevent poor conductivity from occurring when the electronic component on a board.

In addition, resistance of a current path is decreased in inverse proportion to an expanded area of the lower support portion in the metal frame, and a length CP of a current loop may also be decreased. Thus, ESR and ESL of the multilayer capacitor may be reduced.

Table (1) shows a comparison of poor mounting rates between a related-art electronic component using a metal frame and an electronic component according to an exemplary embodiment.

A multilayer capacitor has a length of 2.0 mm and a width of 1.2 mm, and a product having a characteristic of 22 microfarads (ρF). In the case of a related-art metal frame, upper and lower portions of a support have the same thickness.

The poor mounting rate was obtained using a chip mounter to check the degree in which electronic components fall down after 1000 related-art electronic components (Comparative Example) and 1000 electronic components according to an exemplary embodiment are mounted on boards.

TABLE (1)

|  | Number of Mountings [EA] | Number of Poor Mountings [EA] | Poor Mounting Rate [%] |
| --- | --- | --- | --- |
| Comparative Example | 1000 | 25 | 2.50 |
| Exemplary Embodiment | 1000 | 0 | 0.00 |

Referring to Table (1), among 1000 samples of Comparative Example, the number of poor mounting samples was 25 (poor mounting rate is 2.5 percent), while there is no poor mounting sample in the exemplary embodiment.

Accordingly, similarly to the exemplary embodiment, when a lower support portion has a thickness greater than a thickness of an upper support portion, a center of gravity moves down and thus poor mounting may be prevented.

Figure 6:
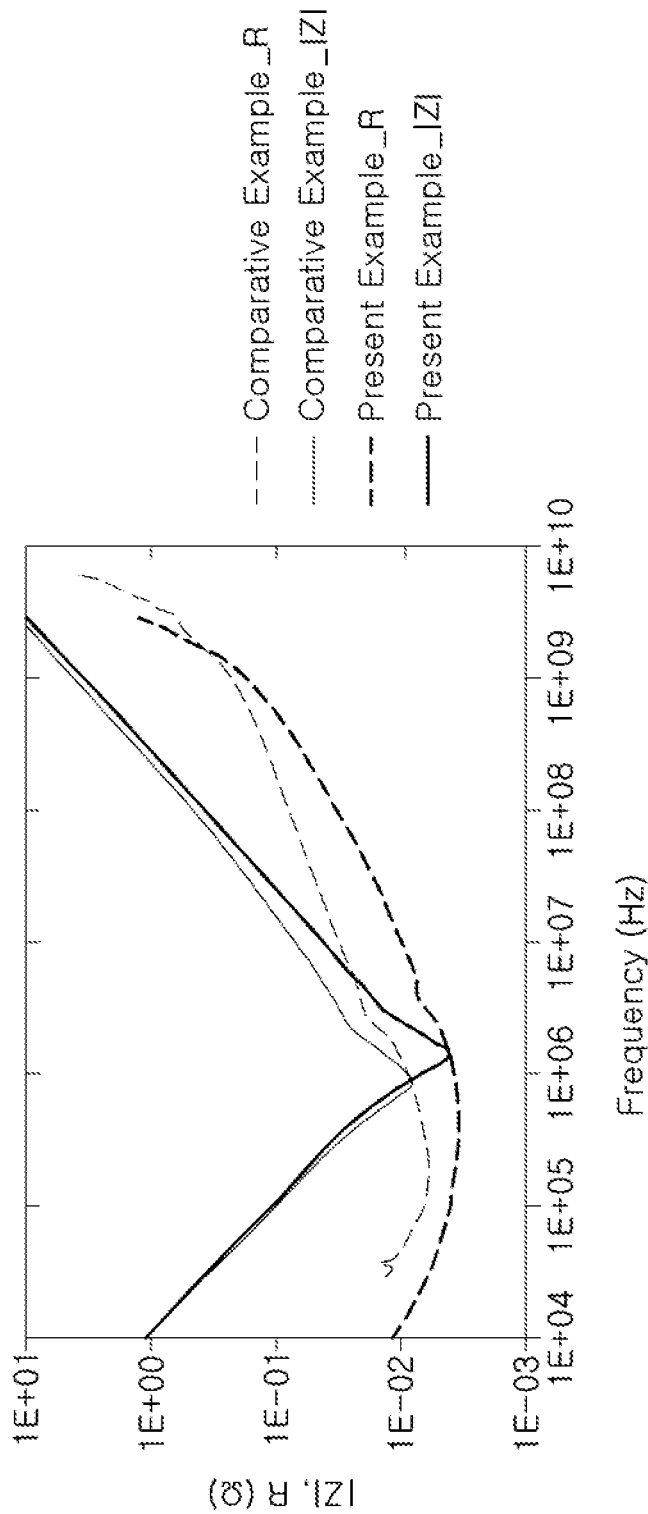
FIG. 6 is a graph comparing resistance and impedance between a related-art electronic component using a metal frame and an electronic component according to an exemplary embodiment in the present disclosure.
Figure 7:
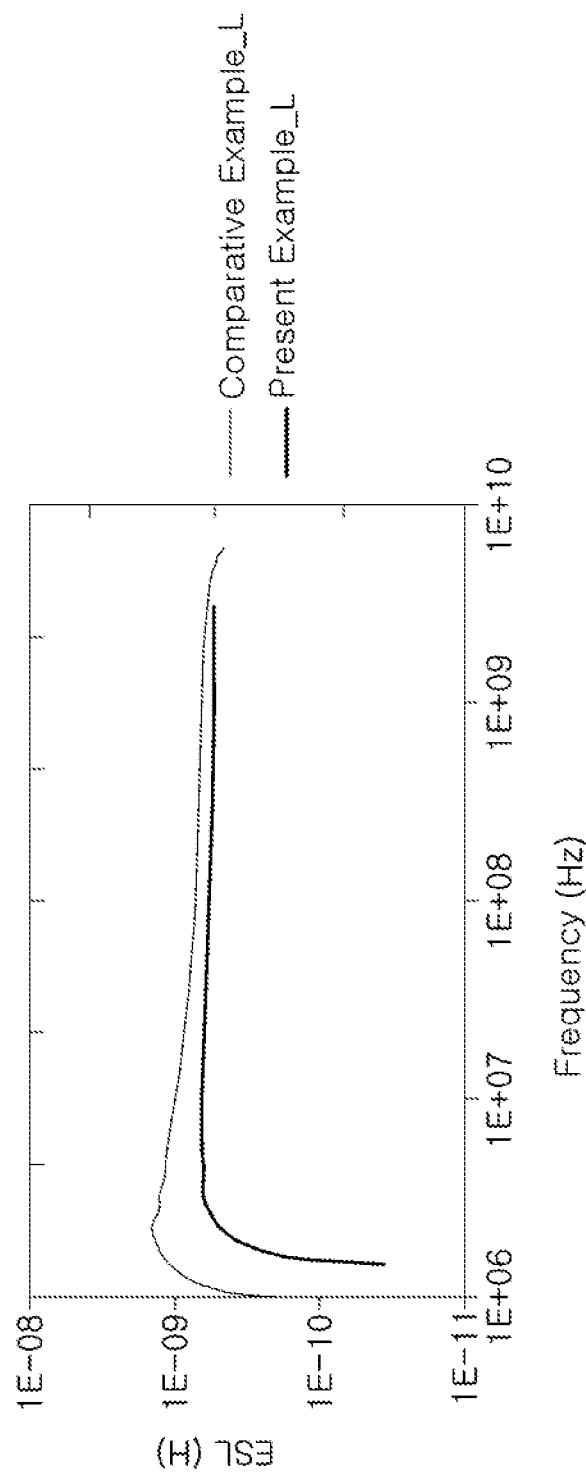
FIG. 7 is a graph comparing ESL between a related-art electronic component using a metal frame and an electronic component according to an exemplary embodiment in the present disclosure.

FIG. 6 is a graph comparing resistance and impedance between a related-art electronic component using a metal frame and an electronic component according to an exemplary embodiment in the present disclosure, and FIG. 7 is a graph comparing ESL between a related-art electronic component using a metal frame and an electronic component according to an exemplary embodiment in the present disclosure.

Table (2) shows capacitance, ESL, and ESR depending on frequencies of Comparative Example, and Table (3) shows capacitance, ESL, and ESR depending on frequencies of exemplary embodiment.

TABLE (2)

| # | SRF (Hz) | Cap. (uF) | ESL (pH) | ESR (mΩ) |
|---|---|---|---|---|
| 1 | 929043 | 14.979 | 931.962 | 8.526 |
| 2 | 901122 | 15.235 | 945.162 | 8.901 |
| 3 | 914976 | 15.135 | 959.593 | 9.049 |
| 4 | 887477 | 15.409 | 949.861 | 8.830 |
| 5 | 914976 | 15.198 | 937.329 | 8.931 |
| Minimum | 887477 | 14.979 | 931.962 | 8.526 |
| Maximum | 929043 | 15.409 | 959.593 | 9.049 |
| Average | 909519 | 15.191 | 944.781 | 8.847 |

TABLE (3)

| # | SRF (Hz) | Cap. (uF) | ESL (pH) | ESR (mΩ) |
|---|---|---|---|---|
| 6 | 1427192 | 14.178 | 630.129 | 4.185 |
| 7 | 1427192 | 14.273 | 617.895 | 3.806 |
| 8 | 1403389 | 14.603 | 625.943 | 4.078 |
| 9 | 1450995 | 14.243 | 621.171 | 4.415 |
| 10 | 1474798 | 13.561 | 630.955 | 4.450 |
| Minimum | 1403389 | 13.561 | 617.895 | 3.806 |
| Maximum | 1474798 | 14.603 | 630.955 | 4.450 |
| Average | 1436714 | 14.172 | 625.219 | 4.187 |

Referring to FIGS. 6 and 7 and Tables (2) and (3), an electronic component according to an exemplary embodiment exhibited capacitance in a high-frequency band, similar to capacitance of Comparative Example. The electronic component according to an exemplary embodiment exhibited ESL and ESR significantly lower than ESL and ESR of Comparative Example.

Accordingly, similarly to the exemplary embodiment, when a lower support portion of a support of a metal frame has a thickness greater than a thickness of an upper support portion of the supports, resistance of a current path is decreased and a length of a current loop is also decreased without significant reduction of capacitance. Thus, ESR and ESL of a multilayer capacitor are expected to be reduced.

As described above, according to an exemplary embodiment, acoustic noise may be reduced by a metal frame. In the metal frame, a lower portion disposed adjacent to a board has a thickness relatively greater than a thickness of an upper portion. Thus, a center of gravity may move down to prevent poor conductivity during board mounting and to reduce ESR and ESL of a multilayer capacitor.

While exemplary embodiments have been shown and described above, it will be apparent to those skilled in the art that modifications and variations could be made without departing from the scope of the present invention as defined by the appended claims.

What is claimed is:

1. An electronic component comprising:
a body including external electrodes disposed on surfaces of the body opposing each other in a first direction, respectively; and
metal frames connected to the external electrodes, respectively,
wherein the metal frames include supports bonded to the external electrodes and mounting portions extending from lower ends of the supports in the first direction and are spaced apart from the body and the external electrodes,
the supports include a lower support portion disposed on a lower side of the body and an upper support portion disposed on an upper side of the body, and the lower support portion has a thickness in a second direction perpendicular to the first direction greater than a thickness of the upper support portion in the first direction, and
the upper support portion and the lower support portion of the supports have external surfaces forming a single flat surface.

2. The electronic component of claim 1, wherein the lower support portion of the supports has the same length in the first direction as a length of the mounting portion in the first direction.

3. The electronic component of claim 1, wherein the body includes dielectric layers and first and second internal electrodes alternately disposed with the dielectric layers interposed therebetween in a thickness direction of the body which is the same as the second direction.

4. The electronic component of claim 3, wherein the external electrodes include:
head portions disposed on the surfaces of the body in the first direction and bonded to the supports; and
band portions extending from the head portions to portions of top and bottom surfaces of the body and portions of side surfaces of the body.

5. The electronic component of claim 4, further comprising:
conductive bonding portions disposed between the head portions of the external electrodes and the upper support portion of the supports.

6. The electronic component of claim 4, wherein the lower support portion of the supports is disposed at a point where an internal side surface of the lower support portion matches an end portion of the band portion disposed above an upper side of the body.

7. The electronic component of claim 1, wherein the external electrodes and the metal frames include plating layers.

8. A mounting board for mounting of an electronic component, the mounting board comprising:
a board having a pair of land patterns disposed on a top surface of the board to be spaced apart from each other; and
an electronic component of claim 1, the electronic component being mounted in such a manner that mounting portions of metal frames are connected to the land patterns of the board, respectively.

9. An electronic component comprising:
a body including external electrodes disposed on surfaces of the body opposing each other in a first direction, respectively; and
metal frames connected to the external electrodes, respectively,
wherein the metal frames include supports bonded to the external electrodes and mounting portions extending from lower ends of the supports in the first direction and are spaced apart from the body and the external electrodes,
the supports include a lower support portion disposed on a lower side of the body and an upper support portion disposed on an upper side of the body, and the lower support portion has a thickness in a second direction perpendicular to the first direction greater than a thickness of the upper support portion in the first direction,
the body includes dielectric layers and first and second internal electrodes alternately disposed with the dielectric layers interposed therebetween in a thickness direction of the body which is the same as the second direction, wherein the external electrodes include:
head portions disposed on the surfaces of the body in the first direction and bonded to the supports; and
band portions extending from the head portions to portions of top and bottom surfaces of the body and portions of side surfaces of the body, and
the lower support portion of the supports is disposed at a point where an internal side surface of the lower support portion matches an end portion of the band portion disposed above an upper side of the body.

10. An electronic component comprising:
a body including external electrodes disposed on surfaces of the body opposing each other in a first direction, respectively; and
metal frames connected to the external electrodes, respectively,
wherein the metal frames include supports bonded to the external electrodes and mounting portions extending from lower ends of the supports in the first direction and are spaced apart from the body and the external electrodes,
the supports include a lower support portion disposed on a lower side of the body and an upper support portion disposed on an upper side of the body,
the lower support portion has only two surfaces in a second direction perpendicular to the first direction, and
the lower support portion has a thickness in the second direction is greater than a thickness of the upper support portion in the first direction.

11. The electronic component of claim 10, wherein the lower support portion of the supports has the same length in the first direction as a length of the mounting portion in the first direction.

12. The electronic component of claim 10, wherein the upper support portion and the lower support portion of the supports have external surfaces forming a single flat surface.

13. The electronic component of claim 10, wherein the body includes dielectric layers and first and second internal electrodes alternately disposed with the dielectric layers interposed therebetween in a thickness direction of the body which is the same as the second direction.

14. The electronic component of claim 13, wherein the external electrodes include:
head portions disposed on the surfaces of the body in the first direction and bonded to the supports; and
band portions extending from the head portions to portions of top and bottom surfaces of the body and portions of side surfaces of the body.

15. The electronic component of claim 14, further comprising:
conductive bonding portions disposed between the head portions of the external electrodes and the upper support portion of the supports.

16. The electronic component of claim 14, wherein the lower support portion of the supports is disposed at a point where an internal side surface of the lower support portion matches an end portion of the band portion disposed above an upper side of the body.

17. The electronic component of claim 10, wherein the external electrodes and the metal frames include plating layers.

18. The electronic component of claim 10, wherein the lower support portion has only two surfaces in the first direction.

19. A mounting board for mounting of an electronic component, the mounting board comprising:
a board having a pair of land patterns disposed on a top surface of the board to be spaced apart from each other; and
an electronic component of claim 10, the electronic component being mounted in such a manner that mounting portions of metal frames are connected to the land patterns of the board, respectively.

* * * * *